(12) United States Patent
Klostermann et al.

(10) Patent No.: US 7,411,854 B2
(45) Date of Patent: Aug. 12, 2008

(54) SYSTEM AND METHOD FOR CONTROLLING CONSTANT POWER DISSIPATION

(75) Inventors: Ulrich Klostermann, Fontainebleau (FR); Dietmar Gogl, Essex Junction, VT (US)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 291 days.

(21) Appl. No.: 11/406,073

(22) Filed: Apr. 18, 2006

(65) Prior Publication Data

US 2007/0242549 A1  Oct. 18, 2007

(51) Int. Cl.
*G11C 5/14* (2006.01)
(52) U.S. Cl. ................. 365/226; 365/158; 365/148; 365/225.5

(58) Field of Classification Search ................. 365/226, 365/158, 148, 210.12, 211, 225.5
See application file for complete search history.

(56) References Cited

U.S. PATENT DOCUMENTS 6,961,263 B2 * 11/2005 Smith et al. ................. 365/158
2005/0180238 A1 * 8/2005 Perner et al. ................. 365/211

* cited by examiner

*Primary Examiner*—Richard T. Elms
*Assistant Examiner*—Toan Le
(74) *Attorney, Agent, or Firm*—Slater & Matsil, L.L.P.

(57) ABSTRACT

A method for controlling the constant power dissipation of a memory cell includes initially measuring the resistance of the memory cell, and subsequently controlling a source to apply a variable level of current or voltage to the memory cell. The variable level of the applied current or voltage is determined in proportion to the measured resistance of the memory cell so as to result in a predefined level of power dissipation within the memory cell, said dissipated power operable to heat the memory cell.

28 Claims, 2 Drawing Sheets

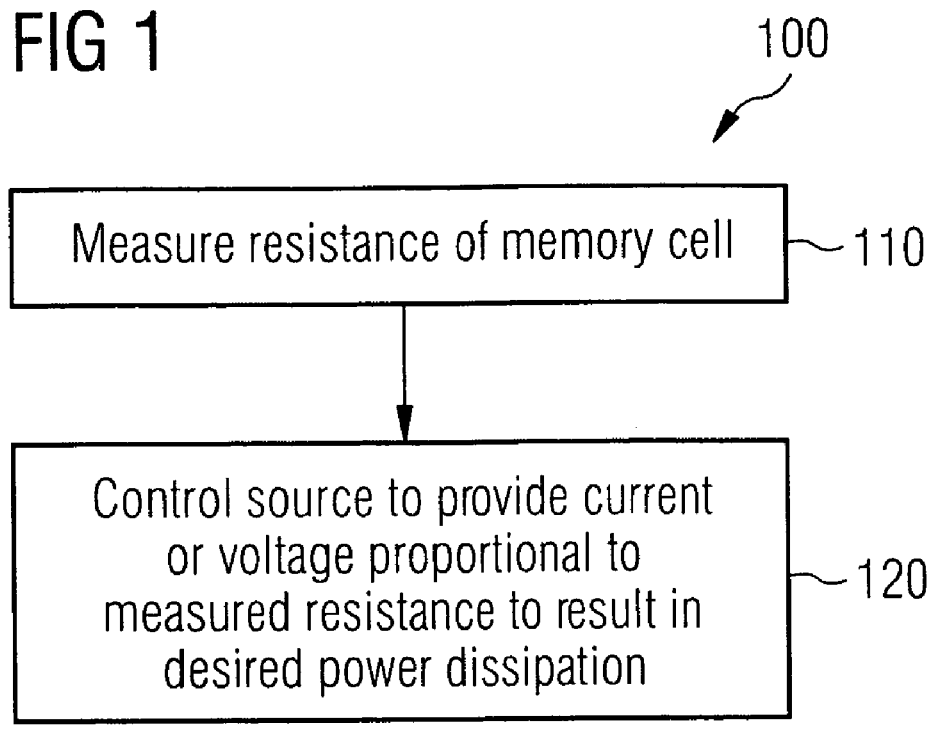
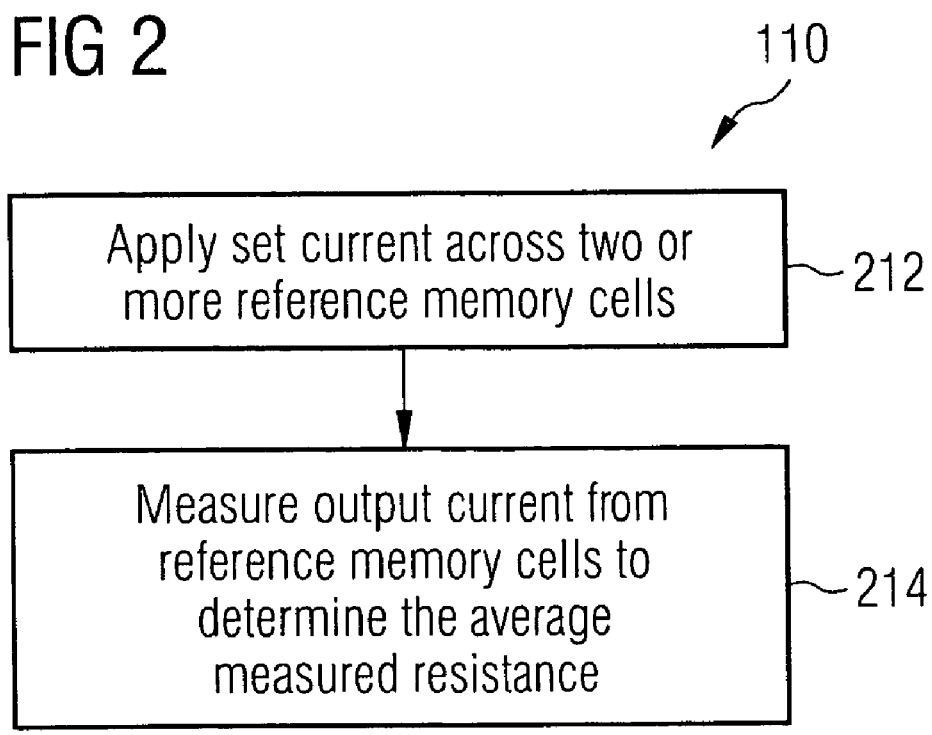

SYSTEM AND METHOD FOR CONTROLLING CONSTANT POWER DISSIPATION

TECHNICAL FIELD

The present invention relates to memory cells, and more particularly to systems and methods for controlling a constant power dissipation in memory cells.

BACKGROUND

As known in the art, magneto random access memory (MRAM) cells are more easily programmed when heated due to the storage or data layer's low coercivity at elevated temperatures. Accordingly, the storage layer can be programmed to the desired parallel/low resistive state or anti-parallel/high resistive state with less writing current than would be required if the memory cell were programmed without heating.

Memory cell programming is typically accomplished by supplying a write current to the memory cell that is to be programmed, the memory cell dissipating a level of power as a result of conducting the supplied writing current, and the dissipated power generating heat. The level of power dissipated is dependent upon the magnitude of the writing current supplied and the resistance of the memory cell, the power dissipation being defined by the equation:

$$\text{Power} = I_{cell}^2 * R_{cell} \qquad \text{eq. (1)}$$

when $I_{cell}$ is the current supplied and $R_{cell}$ is the memory cell's resistance. In this manner, each memory cell is supplied a writing current $I_{cell}$ at a sufficient level, which will generate this level of power dissipation within the memory cell, thereby heating the memory cell to the desired temperature to permit the writing current to program the memory cell in either a parallel or anti-parallel state.

A disadvantage with the conventional approach is the non-uniform heating of memory cells. This is caused by the uniform application of a particular writing current to memory cells that may have differing resistance values. Differences in resistance between memory cells can be attributed to several factors, for example, small variations in the fabrication process and operating conditions. The resistance of a memory cell is also, in part, dependent upon its state, i.e., a memory cell operating in a parallel or logical 0 state will exhibit lower resistance than a memory cell operating in an anti-parallel or logical 1 state. Thus, the application of a uniform writing current to cells with the aforementioned differences will result in those memory cells dissipating different levels of power, and accordingly, operating at different cell temperatures.

The condition of memory cells operating at different temperatures is disadvantageous, in that some memory cells may be dissipate insufficient power and achieve an insufficient level of heating for proper programming, while other memory cells may dissipate excessive power and reach very high temperatures that could damage the memory cell or reduce its normal operational lifetime.

What is therefore needed is a system and method for controlling the heating of a memory cell in a more optimal manner.

SUMMARY OF THE INVENTION

The present invention provides a system and method for controlling the constant power dissipation of a memory cell based upon the measured resistance of the memory cell or collection or memory cells representative of the particular memory cell. By controlling the memory cell's power dissipation as a function of the memory cell's resistance, a desired power dissipation, and accordingly, a desired heating temperature, can be achieved. In this way, memory cells having different resistances can be made to operate at substantially the same power dissipation levels and heating temperatures.

In one exemplary embodiment of the invention, a method for controlling the heating of a memory cell is presented. The method includes initially measuring the resistance of the memory cell, and subsequently controlling a source to apply a variable level of current or voltage to the memory cell. The variable level of the applied current or voltage is determined in proportion to the measured resistance of the memory cell so as to result in a predefined level of power dissipation within the memory cell, the dissipated power operable to heat the memory cell.

These and other features of the invention will be better understood in light of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 illustrates an exemplary method for controlling the constant power dissipation of a memory cell in accordance with the present invention;

FIG. 2 illustrates an exemplary method for measuring the resistance of a memory cell in accordance with the present invention;

DETAILED DESCRIPTION OF ILLUSTRATIVE EMBODIMENTS

Exemplary Heating Methods

Figure 3A:
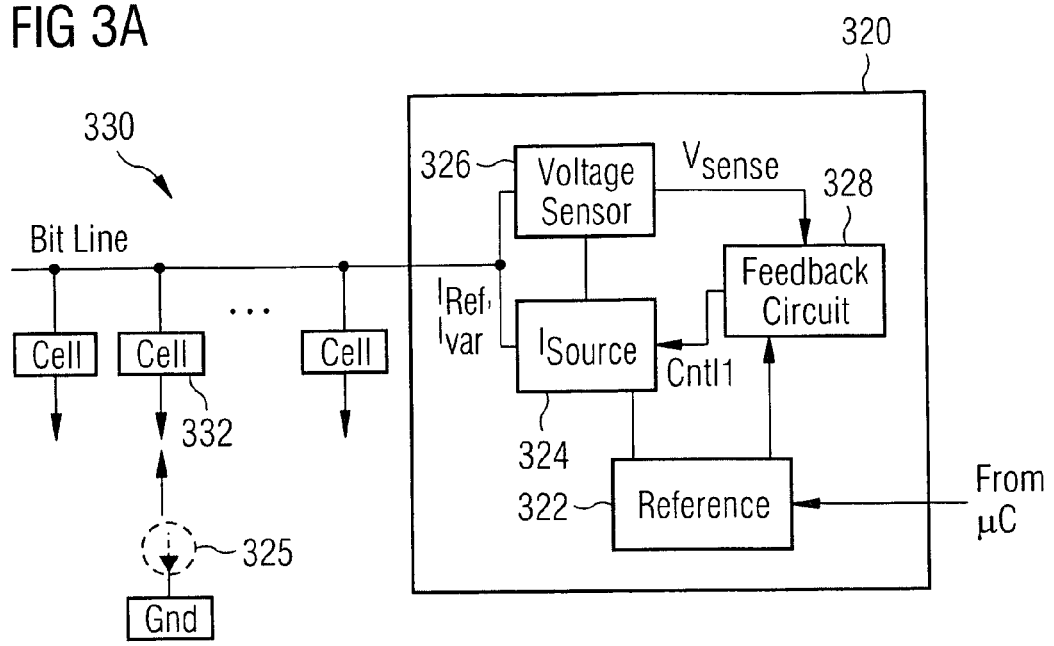
FIG. 3A illustrates a first embodiment of a system configured to control power dissipation of a memory cell in accordance with the present invention.

FIG. 1 illustrates an exemplary method for controlling the heating of a memory cell in accordance with the present invention. The method 100 includes operation 110 in which the resistance of a memory cell is determined. Subsequently at 120, a source, which may be a current or voltage source, is controlled to apply a variable current or voltage, which is proportional to the measured resistance, such that the applied voltage or current produces a predefined level of power dissipation within the memory cell. The power dissipation consumed by the memory cell heats the memory cell responsive to the supplied current or voltage. In a particular embodiment of the invention, the memory cell is a thermally-assisted magneto random access memory (MRAM) cell, and the source supplying the MRAM cell is a variable current source operable to provide a writing current of a sufficient level to generate the predefined power dissipation level within the MRAM cell.

The level of current $I_{source}$ source needed to generate the desired amount of power dissipation $P_{defined}$ within the memory cell having a measured resistance of $R_{meas}$ may be computed using the well-known relationship between resistance, current and generated power:

$$I_{source} = \sqrt{\frac{P_{defined}}{R_{meas}}} \qquad \text{eq. (2)}$$

In another embodiment of the invention, the source is a variable voltage source operable to apply a sufficient voltage across the memory cell to generate the desired amount of power dissipation, and accordingly, memory cell heating. In this embodiment, the required voltage level $V_{source}$ needed to generate a predefined level of power dissipation $P_{defined}$ in the memory cell having a measured resistance $R_{meas}$ can be computed as:

$$V_{source} = \sqrt{P_{defined} * R_{meas}} \qquad \text{eq. (3)}$$

The process of 110 in which the resistance of the memory cell is measured may be performed in several ways. In a first approach, a known voltage is applied to the memory cell, and the current output therefrom is measured. Application and measurement of cell voltages and currents may be performed by applying the measurement voltage onto a bit line coupled to the memory cell, the memory cell's corresponding word line coupled to another potential or ground. Current entering the bit line or exiting the cells to other common connection nodes (e.g., ground line) can be monitored to determine the current output from the memory cell. The resistance of the memory cell is derived straightforwardly from the current and voltage parameters.

FIG. 2 illustrates another embodiment for measuring the resistance of a memory cell in accordance with the present invention. In this embodiment, a collection of two or more reference memory cells are selected at 212, and a predefined current is applied thereto. The description "reference memory cells" refers to two or more memory cells that are selected for the current measurement. Such a group of memory cells may be either dedicated for the resistance measurement, or may be other operational memory cells having a resistance characteristic similar to the desired memory cell. As an example of this latter case, reference memory cells may include a group of memory cells along a commonly coupled bit line, along which the predefined current is supplied. In another embodiment, the reference memory cells represent a quarter memory array, the resistance of which is desired to be determined. In such instances, each of the cells within the group is deemed to exhibit the measured resistance. Of course, finer or coarser granularity may be achieved by including either more proximately- or distally-located memory cells within the reference memory cell group. A reference can also be only one cell to which a current is applied and the voltage is measured. The other way around of applying voltages and measuring currents at single, multiple cells etc. is also possible.

At 214, the output current is measured from the memory cell reference group, and the average value of each memory cell within the reference group is determined by taking the ratio of the voltage applied to the output current. In this manner, the average measured resistance of a group of memory cells can be determined. Cell resistance data can be stored for later retrieval during cell heating operations, or can be determined and subsequently used during successive measurement and heating operations, as will be further described below. Of course in an alternative embodiment, the applied excitation may be in the form of a fixed voltage, the resulting current being measured to determine the average cell resistance.

In a particular embodiment of the invention, the collective heat energy supplied to a memory cell is also controllable. In this embodiment, the duration over which voltage of current is supplied to the memory cell is controlled as a function of the power dissipation level. In particular, the process 120 may be made time-dependent, so as to deliver a particular level of heat energy to the memory cell. Furthermore, the duration of the voltage or current supply may be made variable and dependent upon the generated power dissipation, such that memory cells having lower power dissipation levels would be heated longer to ensure that each memory cell receives substantially the same total heating energy to reach the desired temperature.

Exemplary Heating Systems

FIG. 3A illustrates a first embodiment of a system configured to control heating of a memory cell in accordance with the present invention. The heating control system 320 includes a reference source 322, a current source 324, an optional current meter 325, a voltage sensor 326 and a feedback circuit 328. In an embodiment of the invention, the feedback circuit 328 comprises a temperature sensor for detecting, e.g., the temperature of the chip and/or the temperature of the cell. In a particular embodiment, the system 320 is monolithically-formed in an integrated circuit (Si, SiGe, GaAs, Silicon-on-Insulator (SOI), and the like) with an array of MRAM or other memory cells where application of a constant amount of write power is beneficial (e.g., phase-change memory).

Current source 324 includes inputs for receiving a current level control signal Cntl1, and an output coupled to memory cell 332 for providing a variable level of current thereto, the current being supplied along the bit line of the memory array 330. The heating control system 320 further includes a voltage sensor 326 having an input coupled to memory cell 332 (via the array's bit line) for sensing the cell's voltage, and an output adapted to provide a voltage sensing signal $V_{sense}$. The current source 324 and voltage sensor 326 are illustrated coupled at the same point on the bit line, although in other embodiments they may have different coupling points along the bit line. The feedback circuit 328 includes an input coupled to receive the voltage sensing signal $V_{sense}$, and an output for providing the level control signal Cntl1. The reference source 322 includes an input for receiving control, power, and data signals from a controller (not shown), and outputs for providing control signals to the current source 324, the voltage sensor 326, and feedback circuit 328.

During resistance measurements, one or more cells 332 are activated to conduct along a bit line, as shown. Reference source 322 supplies control signals to the current source 324, voltage sensor 326, and feedback circuit 328, thereby configuring their circuits for operation in measurement mode. In particular, the reference source controls current source 324 to supply reference current $I_{Ref}$ to the bit line. Memory cell 332 draws the reference current $I_{Ref}$, the flow of which develops a voltage on the bit line, which is sensed by the voltage sensor 326. Alternatively, the current drawn by a memory cell 332 (or alternatively, a collection of memory cells) is measured by current meter 325. Memory cell resistance is determinable from either the sensed bit line voltage, or the current measured by meter 325. Resistance measurements may be made during start-up/calibration operations, final wafer test operations or operations of the first start-up of the chip, and the results stored for later use. Alternatively or in addition, resistance measurements may be made just prior to heating operations.

During heating operations, the reference source provides control signals to the current source 324, voltage sensor 326, and feedback circuit 328, thereby configuring their circuits for operation in a heating mode. Reference source 322 controls current source 324 to generate a supply current $I_{source}$, as defined in eq. (2). The power dissipation level $P_{defined}$ is a chosen power dissipation level that will provide sufficient heating to the memory cell, and will depend upon numerous factors, including the size and material construction of the memory cell, present cell temperature and operating conditions, the cell's rate of thermal dissipation, the encapsulation material, thermal insulation of the top and bottom contacts to the wiring, and the like. In an exemplary embodiment for a cell operation temperature in the range of approximately 150° C. to approximately 200° C., a pulse write length in the range of 2 ns to 20 ns and a cooldown in the range of approximately 10 ns to approximately 20 ns, the desired power dissipation is in the range of approximately 50 μWatts to approximately 150 μWatts (i.e., an energy in the range of approximately 100 μWns to approximately 3000 μWns). The parameter $R_{meas}$ defining the cell's measured resistance will typically be based upon the last known resistance value of the memory cell 332. Further, cell resistance may also be based upon a priori knowledge of the memory cell's logical state, as the resistance of the memory cell can vary depending upon its logical state.

Based upon the measured resistance and desired power dissipation, reference source supplies a control signal to the current source 324 to provide a current level in accordance with eq. (2). Voltage sensor 326 detects the voltage on the bit line, and provides an output signal $V_{sense}$ to the feedback circuit 328. A sensed voltage lower than the product of the $R_{meas}$ and $I_{source}$ would indicate too little current is being by supplied by current source 324 to reach the predefined power dissipation level $P_{defined}$, and a higher sensed voltage would indicate an excessive amount of current is being supplied to reach $P_{defined}$. Accordingly, the level control signal Cntl1 is generated to maintain, increase, or decrease the amount of current supplied by the current source 324 in order to produce the desired amount of power dissipation within the memory cell 332.

In one embodiment, cell resistance measurements are made apart from heating operations. For example, the cell resistance measurements may be made array-wide, as a part of the array's calibration process and the like. In another embodiment, cell resistance measurements are made just prior to heating operations. Measurement of cell resistances just before heating can be advantageous, in that the memory cell's resistance under present operation conditions can be determined.

Figure 3B:
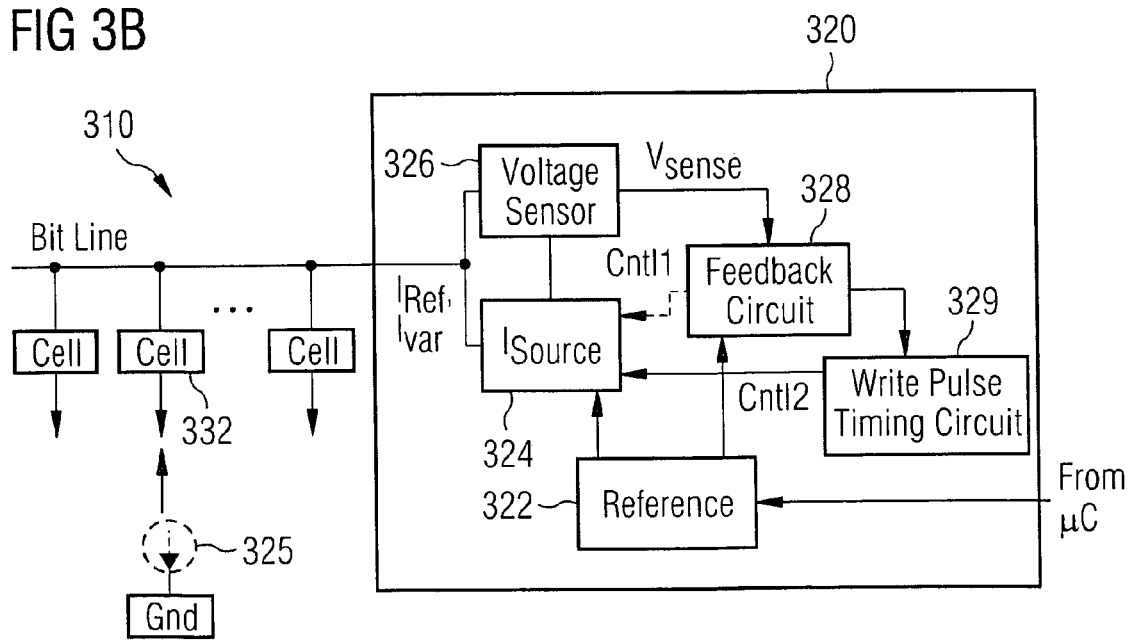
FIG. 3B illustrates a second embodiment of a system configured to control the power dissipation of a memory cell in accordance with the present invention.

FIG. 3B illustrates a second embodiment of a system configured to control heating of a memory cell in accordance with the present invention. In addition to the above-described features, the heating control system 320 further includes a timing circuit 329 operable to generate a variable pulse width control signal Cntl2. Control signal Cntl2 controls the duration over which the current source 324 applies current to the memory cell 332, and accordingly, the total amount of heat energy supplied to the memory cell. In an exemplary embodiment, the heating duration of the memory cell is in the range of approximately 2 ns to approximately 100 ns.

When configured in this embodiment, the timing circuit operates to extend the pulse width, or increase the duration of the current applied to the memory cell when the sensed voltage is below the aforementioned expected voltage. Under the reverse conditions, the timing circuit decreases the pulse width and duration of the current source when the sensed voltage is higher than expected.

Optionally, the feedback circuit 328 additionally generates the aforementioned current level control signal Cntl1 in combination with duration control signal Cntl2. When combined, these two control signals can be used to control both the amplitude and duration of the writing current delivered to the memory cell, thereby permitting control over the memory cell's power dissipation and total heating energy.

In accordance with different embodiments of the invention, a current mode and a voltage mode is provided.

In the current mode, a predefined current through the memory cell is applied and the resulting voltage at the memory cell is measured.

In the voltage mode, a predefined voltage across the memory cell is applied and the resulting current through the memory cell is measured.

The described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for controlling the constant power dissipation of a memory cell, the method comprising:
   measuring resistance of a memory cell; and
   controlling a source to apply a variable level of current or voltage to the memory cell, the variable level of current or voltage determined in proportion to the measured resistance of the memory cell so as to result in a predefined level of power dissipation within the memory cell, said dissipated power operable to heat the memory cell.

2. The method of claim 1, wherein measuring the resistance of the memory cell comprises:
   applying a predefined current through the memory cell; and
   measuring a resulting voltage at the memory cell.

3. The method of claim 1, wherein measuring the resistance of the memory cell comprises:
   applying a predefined current through a plurality of memory cells representative of the memory cell; and
   measuring a resulting voltage at the plurality of representative memory cells to determine an average value of measured resistance.

4. The method of claim 1, wherein measuring the resistance of the memory cell comprises:

applying a predefined voltage across the memory cell; and
measuring a resulting current through the memory cell.

5. The method of claim 1, wherein measuring the resistance of the memory cell comprises:
applying a predefined voltage across a plurality of memory cells representative of the memory cell; and
measuring a resulting current through the plurality of representative memory cells to determine the average value of the measured resistance.

6. The method of claim 1, wherein controlling the source comprises controlling a current source to apply a variable level of current to the memory cell, the level of applied current determined in proportion to the measured resistance of the memory cell so as to result in the predefined level of power dissipation within the memory cell.

7. The method of claim 1, wherein controlling the source comprises controlling a voltage source to apply a variable voltage level to the memory cell, the level of the applied voltage determined in proportion to the measured resistance of the memory cell so as to result in the predefined level of power dissipation within the memory cell.

8. The method of claim 1, wherein controlling the source comprises controlling the source to apply said level of current or voltage for a variable duration, the variable duration determined in proportion to the predefined level of power dissipation.

9. The method of claim 1, wherein the memory cell comprises a magneto random access memory cell, and wherein the source is a current source operable to provide a write current to said magneto random access memory cell.

10. The method of claim 1, wherein the memory cell comprises a magneto random access memory cell, and wherein the source is a current source operable to provide a heating current to said magneto random access memory cell.

11. A system configured to control constant power dissipation of a memory cell, the system comprising:
means for measuring the resistance of the memory cell; and
means for controlling a source to apply a variable level of current or voltage to the memory cell, the variable level of current or voltage determined in proportion to the measured resistance of the memory cell so as to result in a predefined level of power dissipation within the memory cell, said dissipated power operable to heat the memory cell.

12. The system of claim 11, wherein the means for measuring comprises:
a current source having a input for receiving a current control signal and an output coupled to the memory cell for providing a variable level of current thereto;
a voltage sensor having an input coupled to the memory cell for sensing the voltage of the memory cell conducting said variable level of current and an output adapted to provide a voltage sensing signal; and
a feedback circuit having an input coupled to receive the voltage sensing signal and an output for providing the current control signal.

13. The system of claim 12, wherein the current source and the voltage sensor are coupled to a cell connection line.

14. The system of claim 12, wherein the current source and the voltage sensor are coupled to a plate electrode of a CBRAM cell.

15. The system of claim 12, wherein the current source and the voltage sensor are coupled to a bit line.

16. The system of claim 11, wherein the means for measuring comprises:

a current source having a input for receiving a current control signal and an output coupled to the memory cell for providing a variable level of current thereto;
a voltage sensor having an input coupled to the memory cell for sensing the voltage of the memory cell conducting said variable level of current and an output adapted to provide a voltage sensing signal;
a feedback circuit having an input coupled to receive the voltage sensing signal and an output for providing a feedback signal; and
a timing circuit having an input coupled to receive the feedback signal and an output for providing the current control signal over a variable duration.

17. The system of claim 16, wherein the current source and the voltage sensor are coupled to a cell connection line.

18. The system of claim 16, wherein the current source and the voltage sensor are coupled to a plate electrode of a CBRAM cell.

19. The system of claim 16, wherein the current source and the voltage sensor are coupled to a bit line.

20. A memory array, comprising:
a plurality of magneto random access memory cells, each magneto random access memory cell coupled between a word line and a bit line; and
a system coupled to the bit line and configured to control power dissipation of one or more memory cells coupled to said bit line, the system comprising:
means for measuring resistance of the selected memory cell; and
means for controlling a source to apply a variable level of current or voltage to the selected memory cell, the variable level of current or voltage determined in proportion to the measured resistance of the selected memory cell so as to result in a predefined level of power dissipation within the selected memory cell, said dissipated power operable to heat the selected memory cell.

21. The memory array of claim 20, wherein the means for measuring the resistance of the selected memory cell comprises:
a current source having a input for receiving a current control signal and an output coupled to the bit line for providing a variable level of current thereto;
a voltage sensor having an input coupled to the bit line for sensing the voltage of the memory cell conducting said variable level of current and an output adapted to provide a voltage sensing signal; and
a feedback circuit having an input coupled to receive the voltage sensing signal and an output for providing the current control signal.

22. The memory array of claim 20, wherein the means for measuring the resistance of the selected memory cell comprises:
a current source having a input for receiving a current control signal and an output coupled to the bit line for providing a variable level of current thereto;
a voltage sensor having an input coupled to the bit line for sensing the voltage of the memory cell conducting said variable level of current and an output adapted to provide a voltage sensing signal;
a feedback circuit having an input coupled to receive the voltage sensing signal and an output for providing a feedback signal; and
a timing circuit having an input coupled to receive the feedback signal and an output for providing the current control signal over a variable duration.

23. A computer program product, resident on a computer readable medium, operable to store executable instructions for controlling the constant power dissipation of a memory cell, the computer program product comprising:

instruction code to cause measurement of the resistance of the memory cell; and instruction code to control a source to apply a variable level of current or voltage to the memory cell, the variable level of current or voltage determined in proportion to the measured resistance of the memory cell so as to result in a predefined level of power dissipation within the memory cell, said dissipated power operable to heat the memory cell.

24. The computer program product of claim 23, wherein the instruction code to cause measurement of the resistance of the memory cell comprises:

instruction code to cause application of a predefined current across the memory cell; and instruction code to cause measurement of a resultant output current through the memory cell.

25. The computer program product of claim 23, wherein the instruction code to cause measurement of the resistance of the memory cell comprises:

instruction code to cause application of a predefined current across a plurality of memory cells representative of said memory cell; and instruction code to cause measurement of a resultant output current through the plurality of representative memory cells to determine an average value of the measured resistance.

26. The computer program product of claim 23, wherein the instruction code to control the source comprises instruction code to cause a current source to apply a variable level of current to the memory cell, the level of applied current determined in proportion to the measured resistance of the memory cell so as to result in the predefined level of power dissipation within the memory cell.

27. The computer program product of claim 23, wherein the instruction code to control the source comprises instruction code to cause a voltage source to apply a variable voltage level to the memory cell, the level of the applied voltage determined in proportion to the measured resistance of the memory cell so as to result in the predefined level of power dissipation within the memory cell.

28. The computer program product of claim 23, wherein the instruction code to control the source comprises instruction code to cause the source to apply said level of current or voltage for a variable duration, the variable duration determined in proportion to the predefined level of power dissipation.

* * * * *